United States Patent
Park et al.

(10) Patent No.: US 9,356,228 B2
(45) Date of Patent: *May 31, 2016

(54) MAGNETIC TUNNELING JUNCTION DEVICES, MEMORIES, MEMORY SYSTEMS, AND ELECTRONIC DEVICES

(71) Applicants: Jeong Heon Park, Hwaseong-si (KR); Woo Chang Lim, Seoul (KR); Se Chung Oh, Suwon-si (KR); Young Hyun Kim, Hwaseong-si (KR); Sang Hwan Park, Hwaseong-si (KR); Jang Eun Lee, Hwaseong-si (KR)

(72) Inventors: Jeong Heon Park, Hwaseong-si (KR); Woo Chang Lim, Seoul (KR); Se Chung Oh, Suwon-si (KR); Young Hyun Kim, Hwaseong-si (KR); Sang Hwan Park, Hwaseong-si (KR); Jang Eun Lee, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/618,534

(22) Filed: Feb. 10, 2015

(65) Prior Publication Data

US 2015/0155477 A1    Jun. 4, 2015

Related U.S. Application Data

(63) Continuation of application No. 14/306,792, filed on Jun. 17, 2014, now Pat. No. 8,987,798, which is a continuation of application No. 13/398,640, filed on Feb. 16, 2012, now Pat. No. 8,772,846.

(30) Foreign Application Priority Data

Aug. 10, 2011   (KR) .................. 10-2011-0079627

(51) Int. Cl.
| | |
|---|---|
| H01L 21/14 | (2006.01) |
| H01L 43/08 | (2006.01) |
| H01L 43/10 | (2006.01) |
| G06F 13/16 | (2006.01) |
| H01L 43/02 | (2006.01) |

(52) U.S. Cl.
CPC ............... *H01L 43/08* (2013.01); *G06F 13/16* (2013.01); *H01L 43/02* (2013.01); *H01L 43/10* (2013.01)

(58) Field of Classification Search
CPC ......... H01L 21/14; H01L 43/02; H01L 43/08; H01L 43/10
USPC .................. 257/295, 296, 421, 427, E27.006, 257/29.167, 29.323
See application file for complete search history.

(56) References Cited

U.S. PATENT DOCUMENTS

| | | |
|---|---|---|
| 7,939,870 B2 | 5/2011 | Wunderlich et al. |
| 8,476,722 B2 | 7/2013 | Lee et al. |
| 8,508,006 B2 | 8/2013 | Jan et al. |

(Continued)

FOREIGN PATENT DOCUMENTS

| | | |
|---|---|---|
| CN | 101711408 A | 5/2010 |
| CN | 101730913 A | 6/2010 |

(Continued)

*Primary Examiner* — Michael Lebentritt
(74) *Attorney, Agent, or Firm* — Harness, Dickey & Pierce, P.L.C.

(57) ABSTRACT

Provided is a magnetic tunneling junction device including a first structure including a magnetic layer; a second structure including at least two extrinsic perpendicular magnetization structures, each including a magnetic layer and; a perpendicular magnetization inducing layer on the magnetic layer; and a tunnel barrier between the first and second structures.

15 Claims, 14 Drawing Sheets

(56) References Cited

U.S. PATENT DOCUMENTS

| | | | |
|---|---|---|---|
| 8,772,846 B2 * | 7/2014 | Park | H01L 43/08 257/295 |
| 2005/0041462 A1 | 2/2005 | Kent et al. | |
| 2008/0180991 A1 | 7/2008 | Wang | |
| 2009/0109739 A1 | 4/2009 | Ranjan et al. | |
| 2010/0240152 A1 | 9/2010 | Wang | |
| 2012/0043631 A1 | 2/2012 | Ohmori et al. | |
| 2012/0063035 A1 | 3/2012 | Childress et al. | |
| 2012/0112298 A1 | 5/2012 | Kim et al. | |
| 2012/0155164 A1 | 6/2012 | Shukh | |
| 2012/0236631 A1 | 9/2012 | Park et al. | |
| 2012/0280338 A1 | 11/2012 | Abraham et al. | |
| 2013/0029182 A1 | 1/2013 | Zhang et al. | |
| 2013/0215672 A1 | 8/2013 | Zhou et al. | |
| 2013/0258763 A1 | 10/2013 | Ranjan et al. | |

FOREIGN PATENT DOCUMENTS

| | | |
|---|---|---|
| CN | 102376873 A | 3/2012 |
| JP | 2008-010590 A | 1/2008 |
| KR | 0905737 A | 6/2009 |

\* cited by examiner

MAGNETIC TUNNELING JUNCTION DEVICES, MEMORIES, MEMORY SYSTEMS, AND ELECTRONIC DEVICES

CROSS-REFERENCE TO RELATED APPLICATIONS

This application is a continuation of U.S. application Ser. No. 14/306,792, filed on Jun. 17, 2014, which is a continuation of U.S. application Ser. No. 13/398,640, filed on Feb. 16, 2012, and issued as U.S. Pat. No. 8,772,846 on Jul. 8, 2014, which claims priority under 35 U.S.C. §119 to Korean Patent Application No. 10-2011-0079627, filed on Aug. 10, 2011, in the Korean Intellectual Property Office, the entire contents of each of which are hereby incorporated by reference.

BACKGROUND OF THE INVENTION

Embodiments of inventive concepts relate generally to semiconductor memory devices. For example, embodiments of inventive concepts relate to semiconductor memory devices including magnetic tunneling junction devices, memories, memory systems, and electronic devices.

With increasing use of portable computing devices and wireless communication devices, memory devices may require higher density, lower power, and/or nonvolatile properties. Magnetic memory devices may be able to satisfy the aforementioned technical requirements.

An example data storing mechanism for a magnetic memory device is a tunnel magneto resistance (TMR) effect of a magnetic tunnel junction (MTJ). For example, a magnetic memory device with a MTJ have been developed such that an MTJ may have a TMR ratio of several hundred to several thousand percent. However, as pattern dimensions are reduced, it may become more difficult to provide a thermally stable MTJ.

SUMMARY

Embodiments of inventive concepts provide magnetic memory devices having improved thermal stability.

According to example embodiments of inventive concepts a magnetic tunneling junction device may include a first structure including a magnetic layer; a second structure including at least two extrinsic perpendicular magnetization structures, each including a magnetic layer and; a perpendicular magnetization inducing layer on the magnetic layer; and a tunnel barrier between the first and second structures.

In example embodiments, the second structure further including additional extrinsic perpendicular magnetization structures, each including a magnetic layer and; a perpendicular magnetization inducing layer on the magnetic layer.

In example embodiments, the magnetic tunneling junction further includes a perpendicular magnetization preserving layer on one of the perpendicular magnetization inducing layers.

In example embodiments, each magnetic layer has an oxygen affinity less than each perpendicular magnetization inducing layer.

In example embodiments, each perpendicular magnetization preserving layer has an oxygen affinity less than each perpendicular magnetization inducing layer.

In example embodiments, the magnetic layers are made of a ferromagnetic material.

In example embodiments, the ferromagnetic material is at least one of CoFeB, CoFe, NiFe, CoFePt, CoFePd, CoFeCr, CoFeTb, CoFeGd or CoFeNi.

In example embodiments, the magnetic layers have a thickness in a range of about 1 angstrom to about 30 angstroms.

In example embodiments, the magnetic layers have a thickness in a range of about 3 angstroms to about 17 angstroms.

In example embodiments, the perpendicular magnetization inducing layers are in direct contact with the magnetic layers.

In example embodiments, the perpendicular magnetization inducing layers are an oxygen-containing material.

In example embodiments, the perpendicular magnetization inducing layers are a metal oxide.

In example embodiments, the metal oxide is at least one of magnesium oxide, tantalum oxide, titanium oxide, aluminum oxide, magnesium zinc oxide, hafnium oxide, or magnesium boron oxide.

In example embodiments, the perpendicular magnetization inducing layers include at least one of Ta, Ti, U, Ba, Zr, Al, Sr, Hf, La, Ce, Sm, Mg, Th, Ca, Sc, or Y.

In example embodiments, the perpendicular magnetization inducing layers have an electrical resistivity higher than the magnetic layers or the perpendicular magnetization preserving layer.

In example embodiments, the perpendicular magnetization inducing layers have a thickness less than the magnetic layers or the perpendicular magnetization preserving layer.

In example embodiments, the perpendicular magnetization preserving layer has an electrical resistivity lower than the perpendicular magnetization inducing layers.

In example embodiments, the perpendicular magnetization preserving layer is formed of at least one noble metal or copper.

In example embodiments, the at least one noble metal includes ruthenium (Ru), rhodium (Rh), palladium (Pd), silver (Ag), osmium (Os), iridium (Ir), platinum (Pt), or gold (Au).

In example embodiments, the perpendicular magnetization preserving layer is formed of at least one of material having an electrical resistivity lower than tantalum or titanium.

In example embodiments, the magnetic tunneling junction further includes a substrate; wherein the first structure is a lower structure closer to the substrate and the wherein the second structure is an upper structure further from the substrate.

In example embodiments, the magnetic layers of the second structure are free magnetic layers.

In example embodiments, the first structure includes fixed magnetic layers.

In example embodiments, the magnetic tunneling junction further includes a top electrode on the perpendicular magnetization preserving layer.

In example embodiments, the magnetic tunneling junction further includes a substrate; wherein the first structure is an upper structure further from the substrate and the wherein the second structure is a lower structure closer to the substrate.

In example embodiments, the first structure includes at least two extrinsic perpendicular magnetization structures, each including a magnetic layer and a perpendicular magnetization inducing layer on the magnetic layer, a metal layer between two of the perpendicular magnetization inducing layer, and a perpendicular magnetization preserving layer on one of the perpendicular magnetization inducing layers.

In example embodiments, a number of the at least two extrinsic perpendicular magnetization structures in the first structure is greater than a number of the at least two extrinsic perpendicular magnetization structures in the second structure.

According to example embodiments of inventive concepts an electronic device, may include a bus; a wireless interface configured to transmit data to or receive data from a wireless communication network connected to the bus; an I/O device connected to the bus; a controller connected to the bus; and a memory including a semiconductor device including a magnetic tunneling junction device, connected to the bus, configured to store a command code to be used by the controller or user data.

According to example embodiments of inventive concepts a memory system may include a memory device including a semiconductor device including a magnetic tunneling junction device, for storing data; and a memory controller configured to control the memory device to read data stored in the memory device or to write data into the memory device in response to a read/write request of a host.

According to example embodiments of inventive concepts a magnetic tunneling junction device may include a first structure including a fixed magnetic layer; a tunnel barrier on the first structure; a second structure on the tunnel barrier, the second structure including a first magnetic layer on the tunnel barrier, a first perpendicular magnetization inducing layer on the first magnetic layer, an exchange coupling layer on the first perpendicular magnetization inducing layer, a second perpendicular magnetization inducing layer on the exchange coupling layer, a second magnetic layer on the second perpendicular magnetization inducing layer, a third perpendicular magnetization inducing layer on the second magnetic layer.

In example embodiments, the magnetic tunneling junction device further includes a perpendicular magnetization preserving layer on the third perpendicular magnetization inducing layer; and In example embodiments, each magnetic layer has an oxygen affinity less than each perpendicular magnetization inducing layer.

In example embodiments, each perpendicular magnetization preserving layer has an oxygen affinity less than each perpendicular magnetization inducing layer.

In example embodiments, the perpendicular magnetization inducing layers are a metal oxide.

In example embodiments, the metal oxide is at least one of magnesium oxide, tantalum oxide, titanium oxide, aluminum oxide, magnesium zinc oxide, hafnium oxide, or magnesium boron oxide.

In example embodiments, the perpendicular magnetization inducing layers include at least one of Ta, Ti, U, Ba, Zr, Al, Sr, Hf, La, Ce, Sm, Mg, Th, Ca, Sc, or Y.

In example embodiments, the perpendicular magnetization inducing layers have an electrical resistivity higher than the magnetic layers or the perpendicular magnetization preserving layer.

In example embodiments, the perpendicular magnetization inducing layers have a thickness less than the magnetic layers or the perpendicular magnetization preserving layer.

In example embodiments, the magnetic tunneling junction further includes a substrate; wherein the first structure is a lower structure closer to the substrate and the wherein the second structure is an upper structure further from the substrate.

In example embodiments, the magnetic layers of the second structure are free magnetic layers.

In example embodiments, the first structure including fixed magnetic layers.

In example embodiments, the magnetic tunneling junction further includes a top electrode on the perpendicular magnetization preserving layer.

In example embodiments, the magnetic tunneling junction further includes a substrate; wherein the first structure is an upper structure further from the substrate and the wherein the second structure is a lower structure closer to the substrate.

According to example embodiments of inventive concepts an electronic device, may include a bus; a wireless interface configured to transmit data to or receive data from a wireless communication network connected to the bus; an I/O device connected to the bus; a controller connected to the bus; and a memory including a semiconductor device including a magnetic tunneling junction device, connected to the bus, configured to store a command code to be used by the controller or user data.

According to example embodiments of inventive concepts a memory system may include a memory device including a semiconductor device including a magnetic tunneling junction device, for storing data; and a memory controller configured to control the memory device to read data stored in the memory device or to write data into the memory device in response to a read/write request of a host.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
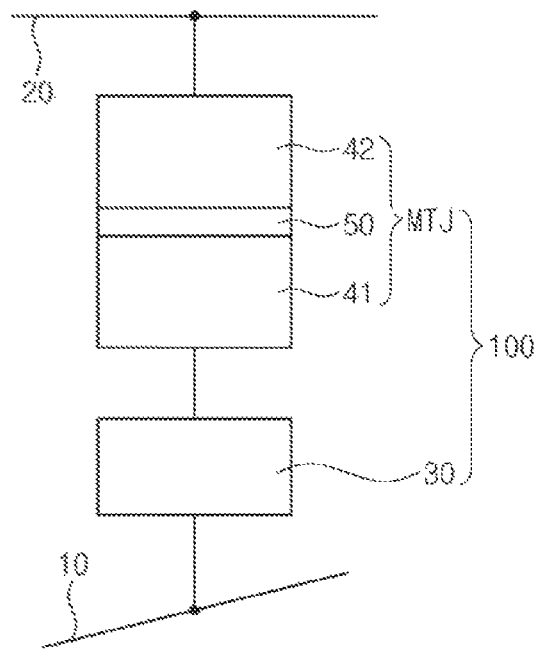
FIG. 1 is a schematic circuit diagram of a unit cell of a magnetic memory device according to example embodiments of inventive concepts.
Figure 2:
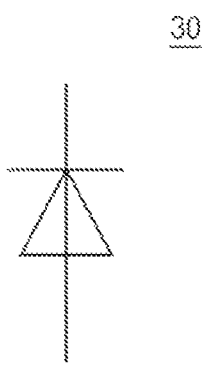
FIGS. 2 through 6 are circuit diagrams exemplarily illustrating selection devices according to example embodiments of inventive concepts.
Figure 3:
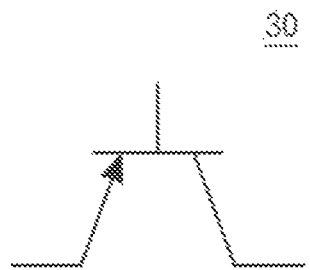
Figure 4:
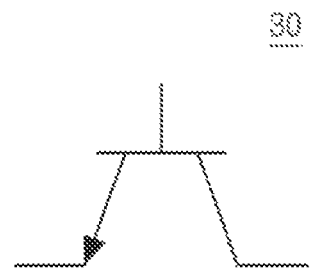
Figure 5:
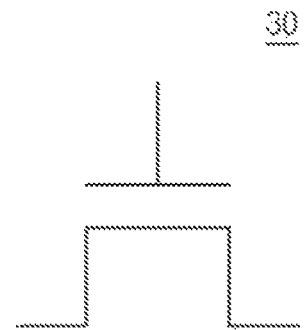
Figure 6:
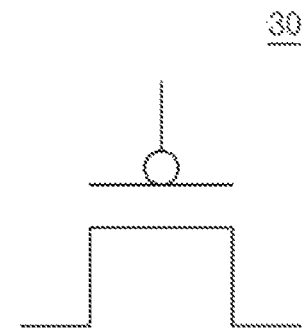

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of inventive concepts will now be described more fully with reference to the accompanying drawings, in which example embodiments are shown. Example embodiments of inventive concepts may, however, be embodied in many different forms and should not be construed as being limited to example embodiments set forth herein; rather, these example embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

According to example embodiments of inventive concepts, a magnetic memory device may be configured to include an extrinsic perpendicular magnetization structure, which will be in more detail below. In addition, Korean Patent Application Nos. 2011-0024429, filed on Mar. 18, 2011, and 2011-0074500, filed on Jul. 28, 2011 disclose technical features related to the extrinsic perpendicular magnetization structure. The entire contents disclosed in Korean Patent Application Nos. 2011-0024429 and 2011-0074500 are hereby incorporated by reference in their entirety.

FIG. 1 is a circuit diagram exemplarily illustrating a unit cell of magnetic memory devices according to example embodiments of inventive concepts.

Referring to FIG. 1, a unit cell 100 may be disposed between first and second interconnection lines 10 and 20 crossing each other. The unit cell 100 may be connected in series to the first and second interconnection lines 10 and 20. The unit cell 100 may include a selection element 30 and a magnetic tunnel junction MTJ. The selection element 30 and the magnetic tunnel junction MTJ may be electrically connected in series to each other. In some example embodiments, one of the first and second interconnection lines 10 and 20 may be used as a word line, and the other may be used as a bit line.

The selection element 30 may be configured to selectively control an electric current passing through the magnetic tunnel junction MTJ. For example, as shown in FIGS. 2 through 6, the selection element 30 may be one of a diode, a pnp bipolar transistor, an npn bipolar transistor, an NMOS field effect transistor (FET), and a PMOS FET. In the case that the selection element 30 is a three-terminal switching device, such as a bipolar transistor and/or MOSFET, an additional interconnection line (not shown) may be connected to the selection element 30.

The magnetic tunnel junction MTJ may include a lower structure 41, an upper structure 42, and a tunnel barrier 50 therebetween. Each of the lower and upper structures 41 and 42 may include at least one magnetic layer, which is formed of a magnetic material.

One of the magnetic layers may be configured to have a fixed magnetization direction, which is not changed by an external magnetic field generated under usual circumstances. Hereinafter, for convenience in description, a term 'pinned layer PL' will be used to represent the magnetic layer having the fixed magnetization property. By contrast, the other of the magnetic layers may be configured to have a magnetization direction being switchable by an external magnetic field applied thereto. Hereinafter, a term 'free layer FRL' will be used to represent the magnetic layer having the switchable magnetization property. That is, as shown in FIGS. 7 and 8, the magnetic tunnel junction MTJ may include at least one free layer FRL and at least one pinned layer PL, which are separated by the tunnel barrier 50.

Electrical resistance of the magnetic tunnel junction MTJ may be sensitive to a relative orientation of magnetization directions of the free and pinned layers FRL and PL. For example, the electrical resistance of the magnetic tunnel junction MTJ may be far greater when the relative orientation is antiparallel than when parallel. This means that the electrical resistance of the magnetic tunnel junction MTJ may be controlled by changing the magnetization direction of the free layer FRL. The magnetic memory devices according to example embodiments of inventive concepts may be realized based on this data storing mechanism.

Figure 7:
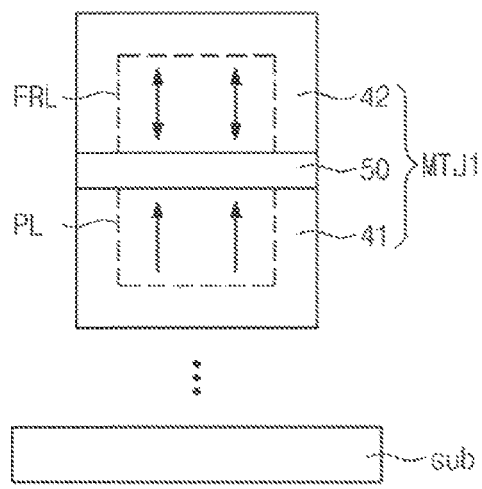
FIG. 7 is a diagram schematically illustrating a first type of MTJ according to example embodiments of inventive concepts.
Figure 8:
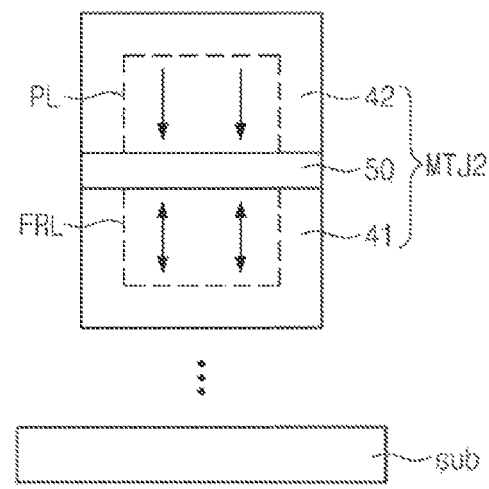
FIG. 8 is a diagram schematically illustrating a second type of MTJ according to example embodiments of inventive concepts.

As shown in FIGS. 7 and 8, the lower and upper structures 41 and 42 of the magnetic tunnel junction MTJ may be sequentially formed on a substrate SUB. In example embodiments, according to a relative configuration between the free layer FRL and the substrate SUB or a forming order of the free layer FRL and the pinned layer PL, the magnetic tunnel junction MTJ may be, for example, classified into two types: (a) a first type of magnetic tunnel junction MTJ1 configured in such a way that the lower and upper structures 41 and 42 include the pinned layer PL and the free layer FRL, respectively, as shown in FIG. 7, and (b) a second type of magnetic tunnel junction MTJ2 configured in such a way that the lower and upper structures 41 and 42 include the free layer FRL and the pinned layer PL, respectively, as shown in FIG. 8.

FIGS. 9 through 17 are sectional views exemplarily illustrating layered structures that may be used as a portion of the magnetic tunnel junction MTJ. That is, each of the lower and upper structures 41 and 42 of the magnetic tunnel junction MTJ may be configured to include one of the layered structures, which will be exemplarily described with reference to FIGS. 9 through 17. In example embodiments where the layered structures of FIGS. 9 through 17 are used as a portion of the lower structure 41, they may be provided as an inverted structure (e.g., in a manner reversed to those shown in FIGS. 9 through 17).

According to example embodiments of inventive concepts, at least one of the lower and upper structures 41 and 42 may be configured to include all or part of an extrinsic perpendicular magnetization structure (EPMS), which will be exemplarily described with reference to FIGS. 9 through 15. For example, the lower structure 41 may be configured to include all or part of one of the extrinsic perpendicular magnetization structures EPMS, which will be described with reference to FIGS. 9 through 15, and the upper structure 42 may be configured to include all or part of one of intrinsic perpendicular magnetization structures (IPMS), which will be exemplarily described with reference to FIGS. 16 and 17. Alternatively, the lower structure 41 may be configured to include all or part of one of the intrinsic perpendicular magnetization structures (IPMS), which will be exemplarily described with reference to FIGS. 16 and 17, and the upper structure 42 may be configured to include all or part of one of the extrinsic perpendicular magnetization structures EPMS, which will be described with reference to FIGS. 9 through 15. Furthermore, in some example embodiments, both of the lower and upper structures 41 and 42 may be configured to include all or part of one of the extrinsic perpendicular magnetization structures EPMS, which will be described with reference to FIGS. 9 through 15.

Referring to FIGS. 9 through 15, the extrinsic perpendicular magnetization structure EPMS may include at least one magnetic layer MGL and/or at least one perpendicular magnetization inducing layer PMI covering the magnetic layer MGL. Here, the magnetic layer MGL of the extrinsic perpendicular magnetization structure EPMS may be used as the magnetic layer constituting the lower structure 41 and/or the upper structure 42. In other words, the free layer FRL or the pinned layer PL may be realized using the magnetic layer MGL of the extrinsic perpendicular magnetization structure EPMS.

In the extrinsic perpendicular magnetization structure EPMS, the magnetic layer MGL may include a ferromagnetic material. For example, the magnetic layer MGL may be formed of at least one of CoFeB, CoFe, NiFe, CoFePt, CoFePd, CoFeCr, CoFeTb, CoFeGd or CoFeNi. According to some aspects of inventive concepts, the magnetic layer MGL may be an intrinsic horizontal magnetic layer exhibiting an intrinsic horizontal magnetization property. In more detail, owing to magnetic anisotropy caused by the geometrical shape of the magnetic layer MGL, the magnetic layer MGL (e.g., of CoFeB) may have a magnetization direction confined to a plane (e.g., xy-plane) parallel to a main surface thereof. (Here, the term 'main surface' represents a surface of the magnetic layer MGL having the largest area and, in most cases, may be a top or bottom surface of the magnetic layer MGL.) The term 'intrinsic horizontal magnetization property' represents this geometry-dependent horizontal magnetic anisotropy. The afore-exemplified ferromagnetic materials may exhibit this intrinsic horizontal magnetization property.

In addition, the magnetic layer MGL may be provided in a form of thin pattern, whose vertical thickness is far smaller than horizontal lengths thereof. In example embodiments, for the extrinsic perpendicular magnetization structure EPMS, a thickness of the respective magnetic layers MGL may be in a range of about 1 angstrom to about 30 angstroms. In more specific embodiments, the thickness of the respective magnetic layers MGL may be in a range of about 3 angstroms to about 14 or to about 17 angstroms.

The perpendicular magnetization inducing layer PMI may be formed to be in direct contact with the magnetic layer MGL, and this directly contacting configuration enables to change a magnetization direction of the magnetic layer MGL from parallel to perpendicular to the main surface of the magnetic layer MGL. That is, the perpendicular magnetization inducing layer PMI may serve as an external factor causing the perpendicular magnetization property for the magnetic layer MGL having the intrinsic perpendicular magnetization property. In this sense, the perpendicular magnetization inducing layer PMI and the magnetic layer MGL being in contact with each other may constitute a magnetic structure with an extrinsic perpendicular magnetization property (e.g., the extrinsic perpendicular magnetization structure). Hereinafter, the magnetic layer MGL in the extrinsic perpendicular magnetization structure may be called "an extrinsic perpendicular magnetic (EPM) layer".

The perpendicular magnetization inducing layer PMI may be an oxygen-containing material. In some example embodiments, the perpendicular magnetization inducing layer PMI may be at least one metal oxide. For example, the perpendicular magnetization inducing layer PMI may be at least one of magnesium oxide, tantalum oxide, titanium oxide, aluminum oxide, magnesium zinc oxide, hafnium oxide, or magnesium boron oxide, but example embodiments of inventive concepts may not be limited thereto. In example embodiments, the perpendicular magnetization inducing layer PMI may have electrical resistivity higher than the magnetic layer MGL. In example embodiments, an electric resistance of the magnetic tunnel junction MTJ may be strongly dependent on the electrical resistivity of the perpendicular magnetization inducing layer PMI. In order to reduce this dependency, the perpendicular magnetization inducing layer PMI may be formed to be thin. For example, the perpendicular magnetization inducing layer PMI may be formed to have a thickness less than the magnetic layer MGL. In some example embodiments, the perpendicular magnetization inducing layer PMI may have a thickness of about 1 angstrom to about 15 angstroms.

Figure 9:
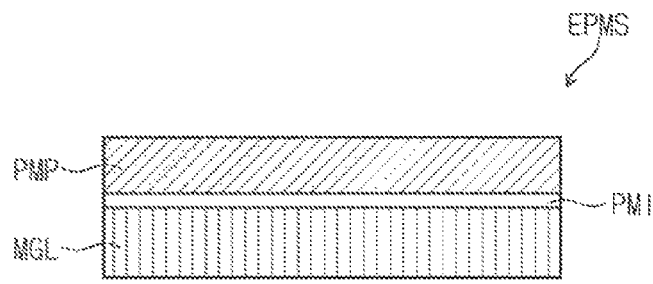
FIGS. 9 through 17 are sectional views exemplarily illustrating layered structures that may be used as a portion of the magnetic tunnel junction MTJ.

In some example embodiments, as exemplarily shown in FIG. 9, the extrinsic perpendicular magnetization structure EPMS may include the magnetic layer MGL and the perpendicular magnetization inducing layer PMI, each of which is provided in a single-layered structure.

Figure 10:
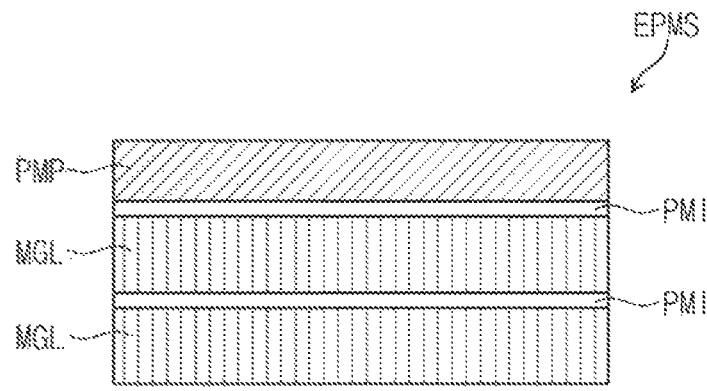
Figure 11:
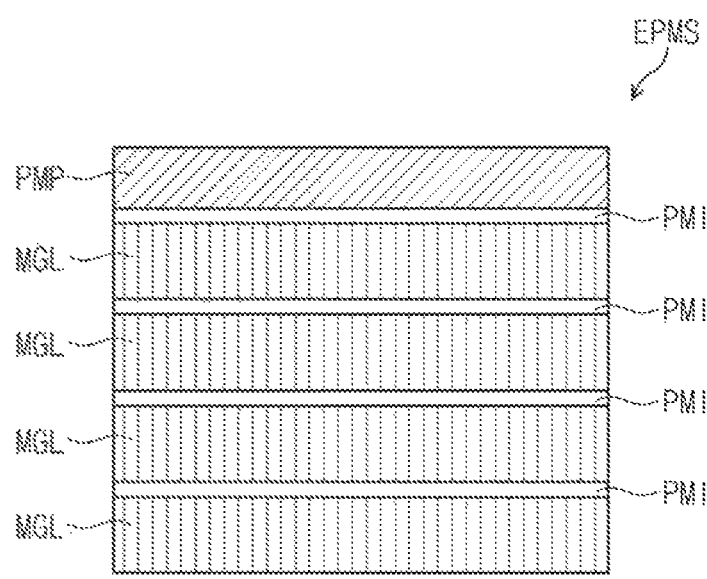
Figure 12:
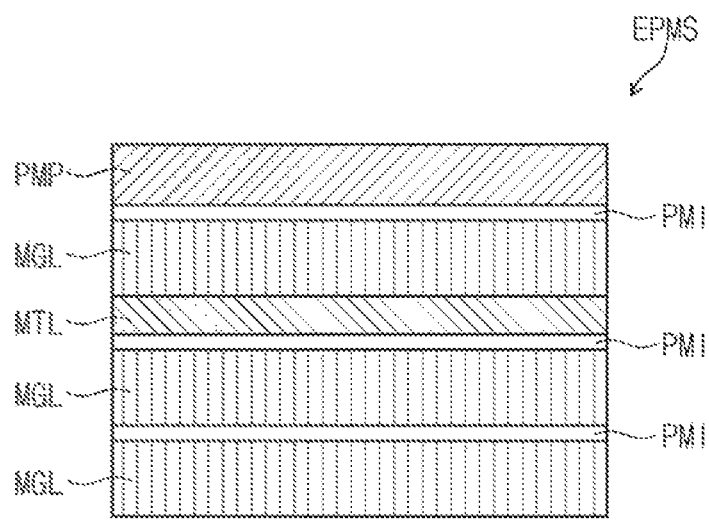
Figure 13:
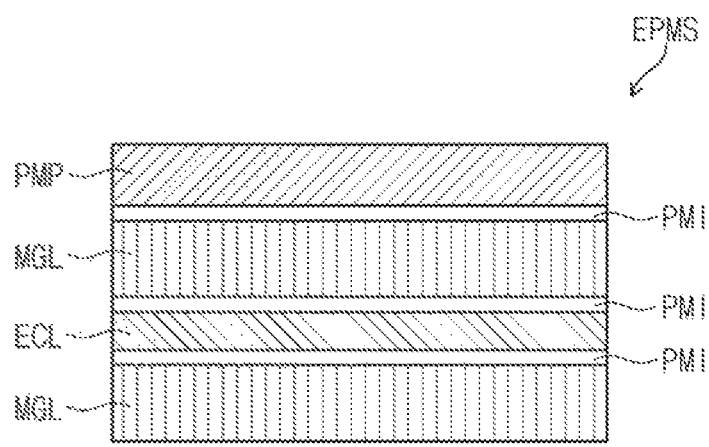
Figure 14:
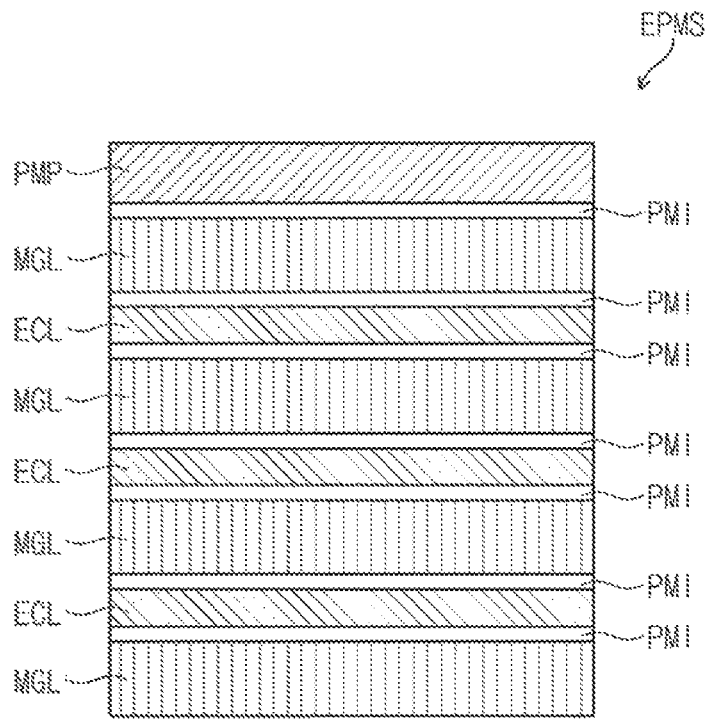

In other example embodiments, as exemplarily shown in FIGS. 10 through 15, the extrinsic perpendicular magnetization structure EPMS may include the magnetic layers MGL provided as a multi-layered structure and the perpendicular magnetization inducing layers PMI provided as a multi-layered structure. The magnetic layers MGL and the perpendicular magnetization inducing layers PMI may be alternatingly stacked. For instance, at least one the perpendicular magnetization inducing layer PMI may be interposed between the magnetic layers MGL. In example embodiments, the extrinsic perpendicular magnetization structure EPMS may be configured in such a way that one perpendicular magnetization inducing layer PMI, as shown in FIGS. 10 and 11, or two perpendicular magnetization inducing layers PMI, as shown in FIGS. 13 and 14, may be interposed between the magnetic layers MGL adjacent to each other.

In extrinsic perpendicular magnetization structures EPMS with the magnetic layers MGL provided as a multi-layered structure, the magnetic layers MGL may have substantially the same thickness and/or material as each other. However, in other example embodiments, at least two of the magnetic layers MGL may differ from each other in terms of thickness and/or material. Similarly, in some example embodiments, the perpendicular magnetization inducing layers PMI may have substantially the same thickness and/or material as each other. However, in other example embodiments, at least two of the perpendicular magnetization inducing layers PMI may differ from each other in terms of thickness and/or material. In example embodiments, all the magnetic layers MGL and all the perpendicular magnetization inducing layers PMI are formed to have the substantially same material and thickness as those exemplarily described above.

In addition, the extrinsic perpendicular magnetization structure EPMS may further include at least one metal layer covering the perpendicular magnetization inducing layer PMI. For example, the extrinsic perpendicular magnetization structure EPMS may further include a perpendicular magnetization preserving layer PMP. In some example embodiments, the perpendicular magnetization preserving layer PMP may be used as the uppermost or lowermost layer of the extrinsic perpendicular magnetization structure EPMS, as exemplarily shown in FIGS. 9 through 15. In some example embodiments, at least one of the perpendicular magnetization inducing layers PMI may be interposed between the perpendicular magnetization preserving layer PMP and the magnetic layer MGL adjacent thereto. In example embodiments, a top electrode may be on the perpendicular magnetic preserving layer PMP.

The perpendicular magnetization preserving layer PMP may be formed of a material having resistivity lower than the perpendicular magnetization inducing layer PMI. For example, the perpendicular magnetization preserving layer PMP may be formed of at least one of noble metals, for example, ruthenium (Ru), rhodium (Rh), palladium (Pd), silver (Ag), osmium (Os), iridium (Ir), platinum (Pt), or gold (Au)) or copper. According to some example embodiments of inventive concepts, the perpendicular magnetization preserving layer PMP may be formed of at least one of materials having resistivity lower than tantalum or titanium.

In addition, according to some aspects of inventive concepts, a portion of the perpendicular magnetization preserving layer PMP, which is in contact with the perpendicular magnetization inducing layer PMI, may be formed of a material hardly reacting with oxygen atoms. The noble metals or copper described above may be selected as a material satisfying this requirement for the perpendicular magnetization preserving layer PMP. In some example embodiments, the perpendicular magnetization preserving layer PMP may be formed of a material hardly reacting with oxygen atoms, even during subsequent process steps or under normal operating conditions.

Figure 15:
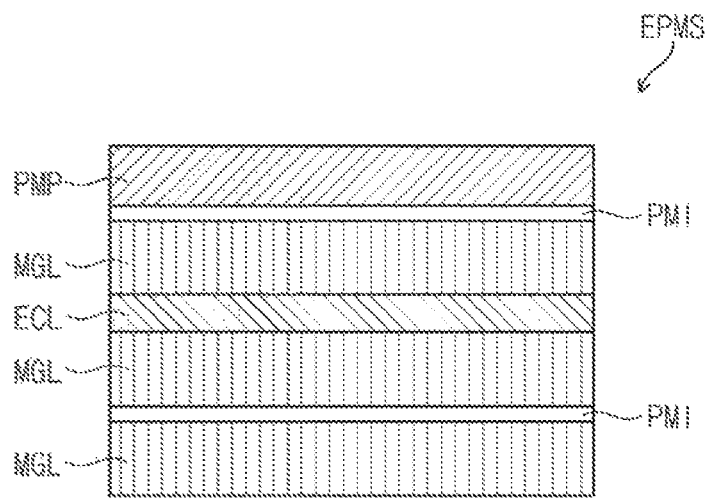

In some example embodiments, the extrinsic perpendicular magnetization structure EPMS may further include at least one exchange coupling layer ECL interposed between the magnetic layers MGL, as exemplarily shown in FIGS. 13 through 15. The exchange coupling layer ECL may be formed of one of noble metals, for example, ruthenium (Ru), rhodium (Rh), palladium (Pd), silver (Ag), osmium (Os), iridium (Ir), platinum (Pt), or gold (Au).

A pair of the magnetic layers MGL, which are disposed adjacent to each other, may exhibit a parallel or antiparallel magnetization property, according to a material and a thickness of the exchange coupling layer ECL. In some example embodiments, the exchange coupling layer ECL may be configured in such a way that the pair of the magnetic layers MGL disposed adjacent to each other exhibit a parallel magnetization property. For instance, the exchange coupling layer ECL may be a ruthenium layer having a thickness of about 2 angstrom to about 10 angstroms. In example embodiments, the magnetic tunnel junction MTJ can be operated with improved stability, such as a stepwise profile in magnetic moment hysteresis curve. However, example embodiments of inventive concepts may not be limited to the embodiments configured to realize the parallel magnetization property.

As shown in FIGS. 13 and 14, the perpendicular magnetization inducing layer PMI may be provided between the exchange coupling layer ECL and one of the magnetic layers MGL adjacent thereto. For example, both of top and bottom surfaces of the exchange coupling layer ECL may be covered with the perpendicular magnetization inducing layers PMI. In example embodiments, in the extrinsic perpendicular magnetization structure EPMS, the layer number of the perpendicular magnetization inducing layers PMI may be greater than that of the magnetic layers MGL. However, in other example embodiments, as shown in FIG. 15, at least one of the top and bottom surfaces of the exchange coupling layer ECL may be in direct contact with the magnetic layer MGL.

In some example embodiments, the number of the exchange coupling layers ECL may be smaller by two or more than that of the magnetic layers MGL. This means that the exchange coupling layer ECL need not be disposed (but may be) at all interlayered spaces provided between the magnetic layers MGL. For example, as exemplarily shown in FIG. 15, the perpendicular magnetization inducing layer PMI or the exchange coupling layer ECL may be singly interposed between the magnetic layers MGL.

The extrinsic perpendicular magnetization structure EPMS may further include at least one metal layer MTL covering the perpendicular magnetization inducing layer PMI. For example, the metal layer MTL may be provided between the magnetic layer MGL and the perpendicular magnetization inducing layer PMI, as shown in FIG. 12. In some example embodiments, the metal layer MTL may be configured in such a way that it can serve as the perpendicular magnetization preserving layer PMP. For instance, the metal layer MTL may be formed of a material hardly reacting with oxygen atoms. For example, the metal layer MTL may be formed of at least one of noble metal or copper. In other example embodiments, the metal layer MTL may be configured in such a way that it can serve as the exchange coupling layer ECL. That is, the metal layer MTL may be configured in such a way that a pair of the magnetic layers MGL disposed adjacent to top and bottom surfaces of the metal layer MTL exhibit a parallel or antiparallel magnetization property.

Figure 16:
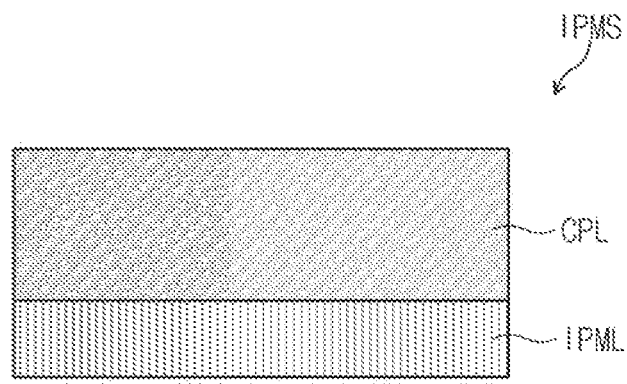
Figure 17:
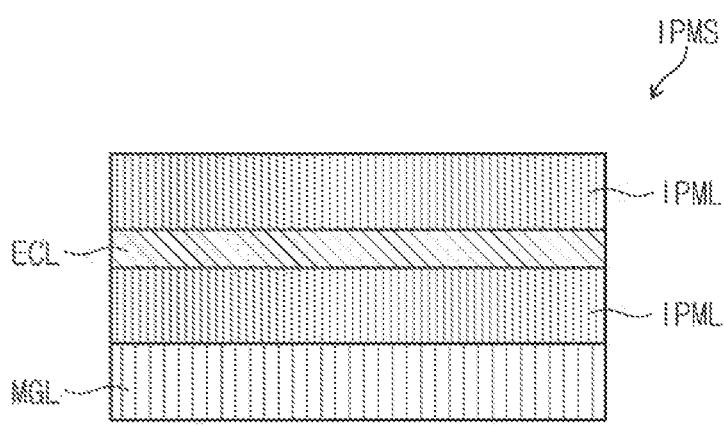

According to example embodiments of inventive concepts, one of the lower and upper structures 41 and 42 may be configured to include an intrinsic perpendicular magnetization structure IPMS depicted in FIGS. 16 and 17.

Referring to FIGS. 16 and 17, the intrinsic perpendicular magnetization structure IPMS may include at least one intrinsic perpendicular magnetic layer IPML. The intrinsic perpendicular magnetic layer IPML of the intrinsic perpendicular magnetization structure IPMS may be used as the magnetic layer constituting the lower structure 41 and/or the upper structure 42. In other words, the free layer FRL or the pinned layer PL may be realized using the intrinsic perpendicular magnetic layer IPML.

The intrinsic perpendicular magnetic layer IPML may be formed of a material exhibiting an intrinsic perpendicular magnetization property. In other words, the intrinsic perpendicular magnetic layer IPML may be configured to have the perpendicular magnetization property, even when there is no external inducing element, such as the perpendicular magnetization inducing layer PMI of the extrinsic perpendicular magnetization structure EPMS.

For example, the intrinsic perpendicular magnetic layer IPML may include at least one of a) CoFeTb, in which the relative content of Tb is 10% or more, b) CoFeGd, in which the relative content of Gd is 10% or more, c) CoFeDy, d) FePt with the $L1_0$ structure, e) FePd with the $L1_0$ structure, f) CoPd with the $L1_0$ structure, g) CoPt with the $L1_0$ structure, h) CoPt with the hexagonal close packing (HCP) structure, i) alloys containing at least one of materials presented in items of a) to h), or j) a multi-layered structure including magnetic and non-magnetic layers alternatingly stacked. The multi-layered structure including the alternatingly-stacked magnetic and non-magnetic layers may include at least one of (Co/Pt)n, (CoFe/Pt)n, (CoFe/Pd)n, (CoP)n, (Co/Ni)n, (CoNi/Pt)n, (CoCr/Pt)n, or (CoCr/Pd)n, where the subscript n denotes the stacking number.

In more detail, as shown in FIG. 16, the intrinsic perpendicular magnetization structure IPMS may include the intrinsic perpendicular magnetic layer IPML having a single-layered structure and a capping layer CPL. The capping layer CPL may serve as a capping element capable of protecting the intrinsic perpendicular magnetic layer IPML thereunder. The capping layer CPL may be formed of at least one of ruthenium (Ru), tantalum (Ta), palladium (Pd), titanium (Ti), platinum (Pt), silver (Ag), gold (Au), or copper (Cu).

In some example embodiments, the intrinsic perpendicular magnetization structure IPMS shown in FIG. 16 may be provided as an inverted structure to constitute the lower structure 41. In example embodiments, the capping layer CPL may serve as a seed layer for growing the intrinsic perpendicular magnetic layer IPML thereon. For instance, when the intrinsic perpendicular magnetic layer IPML is formed of a material with $L1_0$ structure, the capping layer CPL may include a conductive metal nitride layer with the sodium chloride crystal structure (e.g., of titanium nitride, tantalum nitride, chromium nitride, or vanadium nitride).

Referring to FIG. 17, the intrinsic perpendicular magnetization structure IPMS may include a pair of the intrinsic perpendicular magnetic layers IPML and an exchange coupling layer ECL interposed therebetween. The exchange coupling layer ECL may be formed of one of noble metals, such as, ruthenium (Ru), rhodium (Rh), palladium (Pd), silver (Ag), osmium (Os), iridium (Ir), platinum (Pt), or gold (Au). Similar to the example embodiments described with reference to FIGS. 13 through 15, the pair of the intrinsic perpendicular magnetic layers IPML, which are disposed adjacent to each other, may exhibit a parallel or antiparallel magnetization property, according to a material and a thickness of the exchange coupling layer ECL. In some example embodiments, the exchange coupling layer ECL of the intrinsic perpendicular magnetization structure IPMS may be configured in such a way that the intrinsic perpendicular magnetic layers IPML exhibit the antiparallel magnetization property (e.g., synthetic antiferromagnetic (SAF) property).

Figure 18A:
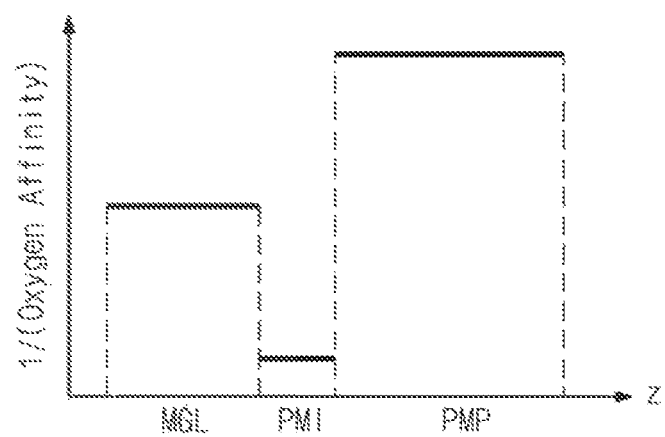
FIGS. 18A and 18B are graphs illustrating some aspects of an extrinsic perpendicular magnetization structure.
Figure 18B:
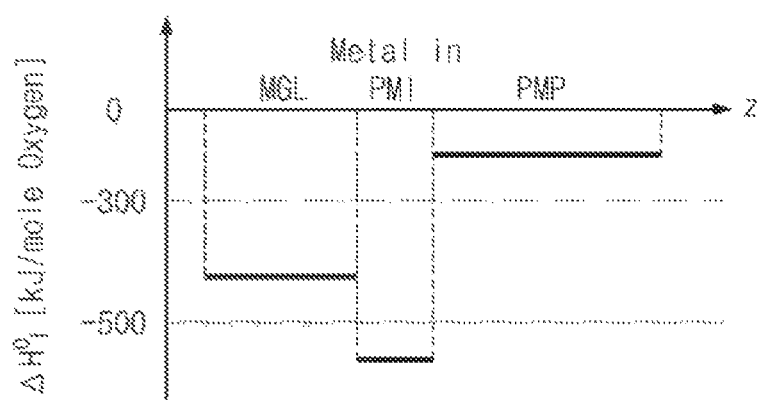

FIGS. 18A and 18B are graphs illustrating some aspects of the extrinsic perpendicular magnetization structure according to example embodiments of inventive concepts. As described above, the perpendicular magnetization preserving layer PMP may be formed of a material hardly reacting with oxygen atoms, even during subsequent process steps or under normal operating conditions.

For example, as shown in FIG. 18A, the perpendicular magnetization preserving layer PMP may be a material having an oxygen affinity less than metallic elements constituting the perpendicular magnetization inducing layer PMI. The oxygen affinity may be represented by the standard enthalpy of reaction for the formation of metal oxide ($\Delta H0f$ [kJ/mole Oxygen]), as shown in FIG. 18B. In some example embodiments, the standard enthalpy of reaction $\Delta H0f$ of the metallic elements constituting the perpendicular magnetization inducing layer PMI may be less than about −500 [kJ/mole Oxygen], and the standard enthalpy of reaction $\Delta H^0_f$ of the perpendicular magnetization preserving layer PMP may be greater than −300 [kJ/mole Oxygen]. That is, the standard enthalpy of reaction may be greater for the metallic elements constituting the perpendicular magnetization inducing layer PMI than for the perpendicular magnetization preserving layer PMP, in terms of the absolute value. In some example embodiments, the metallic elements constituting the perpendicular magnetization inducing layer PMI may be at least one of Ta, Ti, U, Ba, Zr, Al, Sr, Hf, La, Ce, Sm, Mg, Th, Ca, Sc, or Y, and the perpendicular magnetization preserving layer PMP may include at least one of Au, Ag, Pt, Pd, Rh, Ru, Cu, Re, or Pb. As shown in FIG. 18A or 18B, the magnetic layer MGL may be formed of a material having an oxygen affinity less than the metallic elements constituting the perpendicular magnetization inducing layer PMI and greater than the perpendicular magnetization preserving layer PMP. Further, chemical reactivity with oxygen can be represented by various physical quantities. For example, physical quantities, such as an oxidation potential or a free energy in oxidation, can be used to quantitatively represent the chemical reactivity with oxygen, instead of the oxygen affinity or the standard enthalpy of reaction.

Figure 19:
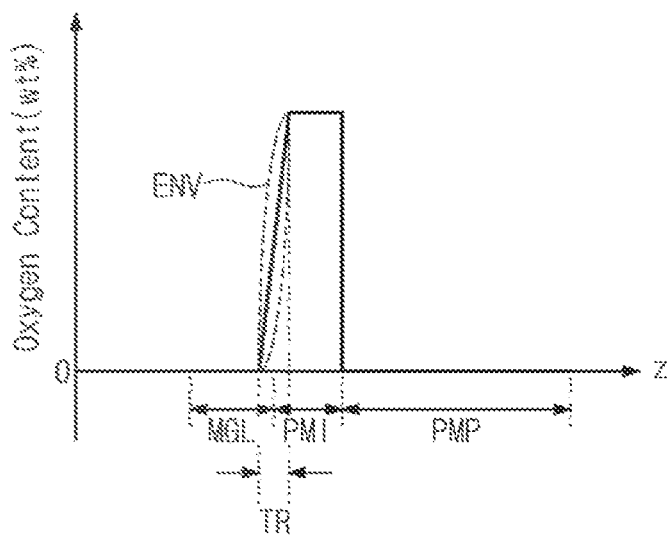
FIG. 19 is a graph illustrating other aspects of an extrinsic perpendicular magnetization structure.

FIG. 19 is a graph illustrating other aspects of the extrinsic perpendicular magnetization structure.

Referring to FIG. 19, the extrinsic perpendicular magnetization property may result from a chemical combination of atoms in the magnetic layer MGL and oxygen atoms in the perpendicular magnetization inducing layer PMI. In example embodiments, as shown in FIG. 19, a transition region TR, whose oxygen content is higher than the magnetic layer MGL and lower than the perpendicular magnetization inducing layer PMI, may be formed between the magnetic layer MGL and the perpendicular magnetization inducing layer PMI. In some example embodiments, there is no reason that the oxygen content should be linear in the transition region TR. For example, in the transition region TR, the oxygen content may vary monotonically within a specific envelope ENV, as shown in FIG. 19.

Alternatively, the perpendicular magnetization preserving layer PMP may be formed of a material hardly reacting with oxygen atoms, even during subsequent processes or under normal operating conditions. In some example embodiments, as shown in FIG. 19, the perpendicular magnetization inducing layer PMI may be formed to have finite oxygen content, and the perpendicular magnetization preserving layer PMP may be formed to have a substantially infinitesimal oxygen content (for instance, less than that of the perpendicular magnetization inducing layer PMI). In some example embodiments, the oxygen content may vary abruptly at an interface between the perpendicular magnetization inducing layer PMI and the perpendicular magnetization preserving layer PMP. That is, an absolute value of gradient of the oxygen content may be greater at the interface between the perpendicular magnetization inducing layer PMI and the perpendicular magnetization preserving layer PMP than at the transition region TR.

In other example embodiments, the transition region TR may be formed in the whole region of the perpendicular magnetization inducing layer PMI. For example, in the graph of FIG. 19, a z-directional gradient of oxygen content may have a finite non-vanishing value in the whole region of the perpendicular magnetization inducing layer PMI or between the magnetic layer MGL and the perpendicular magnetization preserving layer PMP. In some example embodiments, the oxygen content of the perpendicular magnetization inducing layer PMI may be greater at a region adjacent to the perpendicular magnetization preserving layer PMP than at other region adjacent to the magnetic layer MGL.

Figure 20:
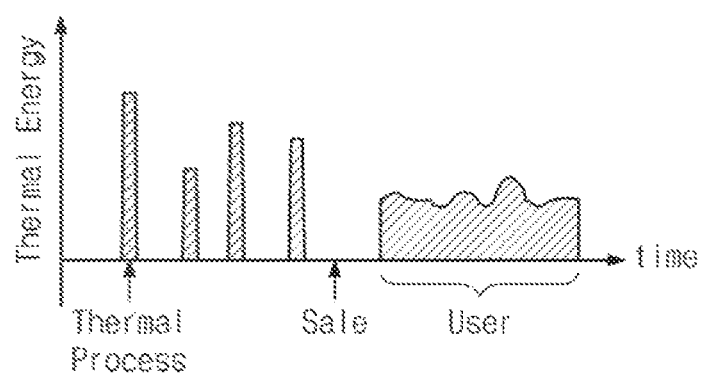
FIG. 20 is a diagram presented to describe still other aspects of an extrinsic perpendicular magnetization structure.

FIG. 20 is a diagram presented to describe still other aspects of the extrinsic perpendicular magnetization structure.

The formation of the magnetic memory device may further include process steps (for example, at least one thermal treatment step, a wiring step, and so forth), which will be performed after forming the perpendicular magnetization inducing layer PMI and the perpendicular magnetization preserving layer PMP. As shown in FIG. 20, a thermal energy, which may be generated during these subsequent process steps or by user's normal operation, may be supplied to the perpendicular magnetization inducing layer PMI. This thermal energy may dissociate oxygen atoms from the perpendicular magnetization inducing layer PMI.

However, in the case that the perpendicular magnetization preserving layer PMP having the low oxygen affinity is formed to cover the perpendicular magnetization inducing layer PMI, it is possible to prevent the dissociated oxygen atoms from diffusing away from the perpendicular magnetization inducing layer PMI. For instance, if the thermal energy is not supplied from outside the magnetic tunnel junction MTJ, the dissociated oxygen atoms may be restored to its chemically stable state. Here, in the case that, as the aforedescribed embodiments, the perpendicular magnetization preserving layer PMP is formed of a material having a low oxygen affinity, the dissociated oxygen atoms may be recombined with metal elements constituting the perpendicular magnetization inducing layer PMI, not the perpendicular magnetization preserving layer PMP. That is, the perpendicular magnetization inducing layer PMI may be restored to its original state before the supply of the thermal energy.

Figure 21:
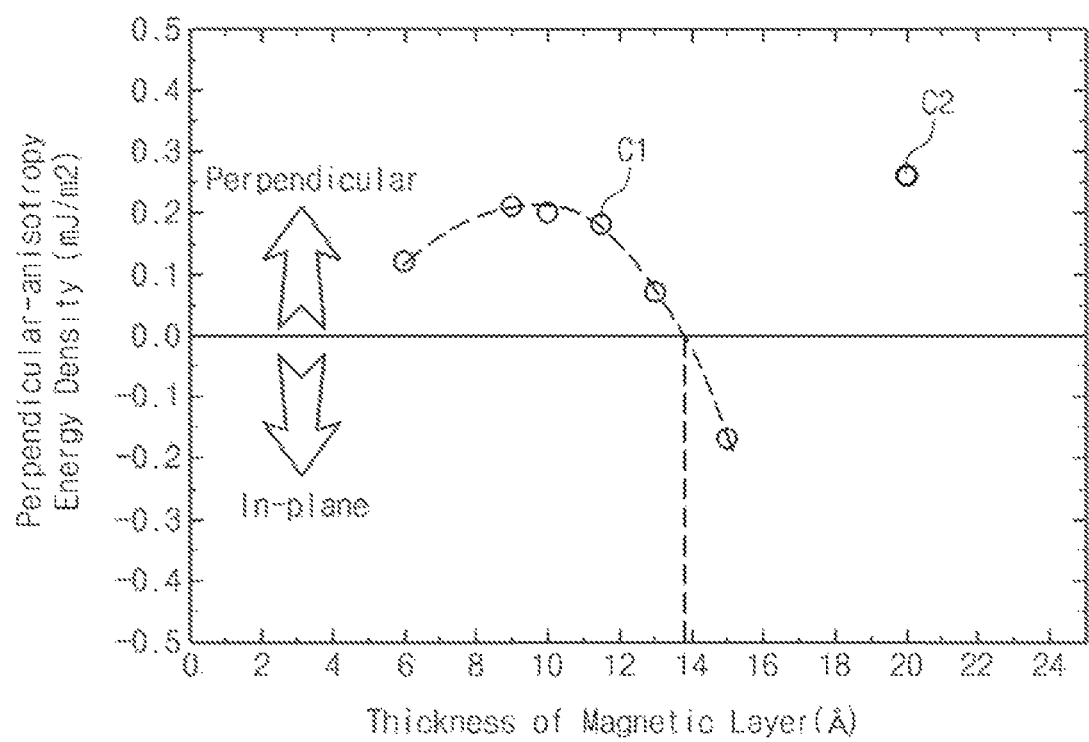
FIG. 21 is an experimental graph exemplarily showing some magnetic properties of an MTJ according to example embodiments of inventive concepts.

FIG. 21 is an experimental graph exemplarily showing some magnetic properties of MTJ according to example embodiments of inventive concepts.

In the experiment, two types of samples were tested to measure a perpendicular anisotropy energy density of the magnetic layer therein with respect to a thickness of magnetic layer. In the graph of FIG. 21, a curve denoted by a reference numeral C1 represents experiment data obtained from the first type of MTJ samples including the extrinsic perpendicular magnetization structure EPMS of FIG. 9, and a point denoted by a reference numeral C2 represents an experiment datum obtained from the second type of MTJ sample including the extrinsic perpendicular magnetization structure EPMS of FIG. 13. That is, the first corresponds to the extrinsic perpendicular magnetization structure EPMS including a single-layered magnetic layer, and the second corresponds to the extrinsic perpendicular magnetization structure EPMS including the multi-layered magnetic layers.

In all samples, the tunnel barrier 50 was formed of magnesium oxide (MgO), the magnetic layer MGL and the perpendicular magnetization inducing layers PMI were formed of CoFeB and Ta—O, respectively, and the perpendicular magnetization preserving layer PMP and the exchange coupling layer ECL were formed of Ru. The remaining conditions of the experiment were substantially the same. In the graph of FIG. 21, the horizontal axis represents a total thickness of the magnetic layers constituting the extrinsic perpendicular magnetization structure, and the vertical axis represents a perpendicular anisotropy energy density measured from the magnetic layer.

Referring to FIG. 21, for samples depicted by the reference numeral C1, the magnetic layer of CoFeB had a positive perpendicular anisotropy energy density, when it was formed to a thickness of about 14 angstrom or less. That is, for the extrinsic perpendicular magnetization structure EPMS of FIG. 9 or the samples of the first type, the magnetic layer exhibited perpendicular anisotropy in a specific thickness range t of approximately 3 angstrom to approximately 14 angstrom, although the magnetic layer was formed of CoFeB having the intrinsic horizontal magnetization property.

By contrast, as depicted by the reference numeral C2, even when the multi-layered magnetic layers had a total thickness of about 20 angstrom, the perpendicular anisotropy energy density was positive and was greater than that of the single-layered magnetic layer containing structure of FIG. 9. This means that, when the magnetic layers of the extrinsic perpendicular magnetization structure are provided as a multi-layered structure, the extrinsic perpendicular magnetization structure can be formed to have an increased total thickness without a reduction or even with an increase in perpendicular anisotropy energy density. The increase in the total thickness of the magnetic layers enables to prevent deterioration in thermal stability of perpendicular-type MTJs, which may occur in MTJs with a thin magnetic layer.

As described above, the layered structures exemplarily shown in FIGS. 9 through 17 may serve as part of the magnetic tunnel junctions MTJ1 and MTJ2 shown in FIG. 7 and FIG. 8, respectively. For example, as exemplarily shown in FIG. 22, the upper and lower structures 42 and 41 may be realized using two layered structures described with reference to FIGS. 10 and 17, respectively. Here, the layered structure described with reference to FIG. 10 may be the extrinsic perpendicular magnetization structure, while the layered structure described with reference to FIG. 17 may be the intrinsic perpendicular magnetization structure IPMS configured to exhibit the SAF property. In this sense, the structure of FIG. 22 corresponds to the MTJ structure of FIG. 7, in which the upper structure 42 includes the free layer FRL and the lower structure 41 includes the pinning layer PL.

Figure 23:
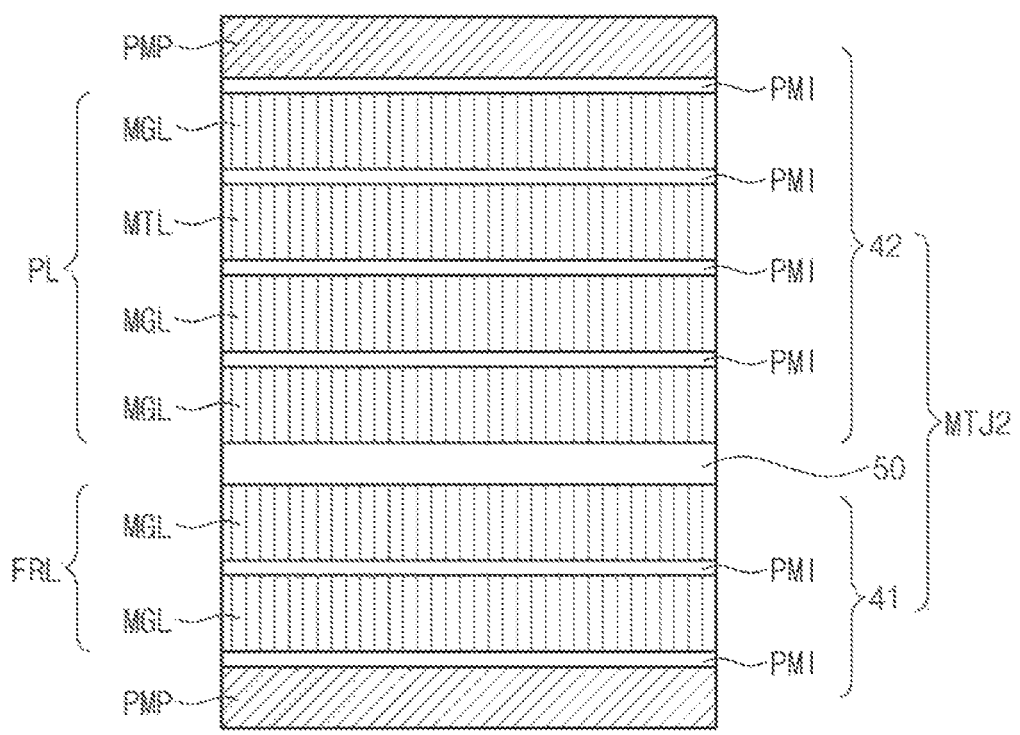
FIG. 23 is a sectional view exemplarily showing the second type of magnetic tunnel junction according to example embodiments of inventive concepts.

Moreover, as exemplarily shown in FIG. 23, the lower and upper structures 41 and 42 may be realized using two layered structures described with reference to FIGS. 10 and 11, respectively. Here, the layered structure of FIG. 11 may be configured to be greater than that of FIG. 10 in terms of the total thickness of magnetic layers therein, and as a result, the layered structure of FIG. 11 may serve as a hard layer or a pinning layer of MTJ. In this sense, the structure of FIG. 23 corresponds to the MTJ structure of FIG. 8, in which the upper structure 42 includes the pinning layer PL and the lower structure 41 includes the free layer FRL.

Figure 22:
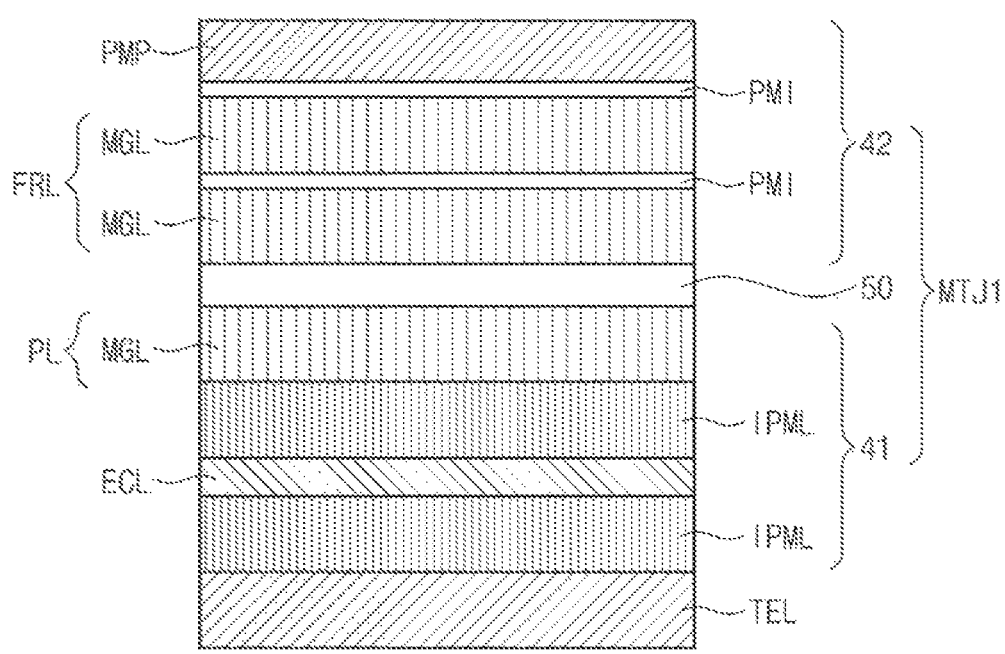
FIG. 22 is a sectional view exemplarily showing the first type of magnetic tunnel junction according to example embodiments of inventive concepts.

Although the magnetic tunnel junctions according to some example embodiments of inventive concepts were exemplarily described with reference to FIGS. 22 and 23, but example embodiments of inventive concepts need not be limited thereto.

Figure 24:
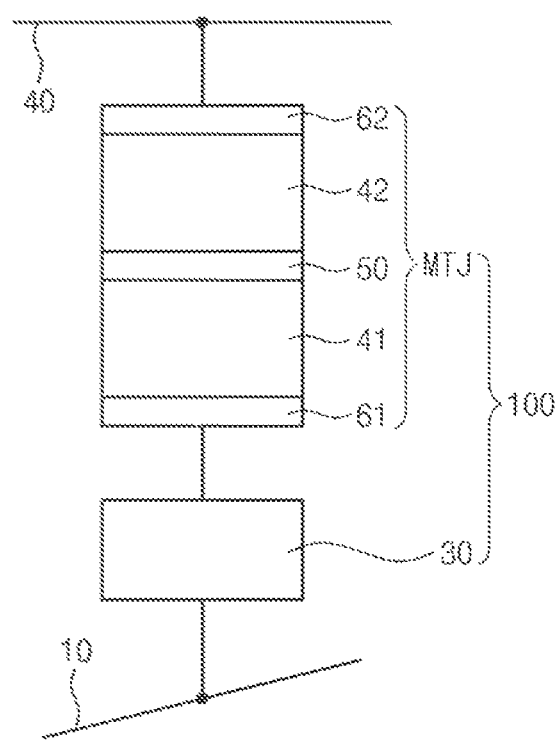
FIG. 24 is a schematic circuit diagram of a unit cell of a magnetic memory device according to example embodiments of inventive concepts.

FIG. 24 is a schematic circuit diagram of a unit cell of a magnetic memory device according to modified embodiments of inventive concepts.

Referring to FIG. 24, a magnetic tunnel junction MTJ according to the present embodiments may further include at least one of a lower electrode structure 61 disposed below the lower structure 41 and an upper electrode structure 62 disposed on the upper structure 42. The lower electrode structure 61 may be disposed between the first interconnection line 10 and the lower structure 41 or between the selection element 30 and the lower structure 41, and the upper electrode structure 62 may be disposed between the second interconnection line 20 and the upper structure 42.

In some example embodiments, at least one of the lower and upper electrode structures 61 and 62 may be configured to have a single-layered structure. In other example embodiments, at least one of the lower and upper electrode structures 61 and 62 may be configured to have a multi-layered structure. In addition, the lower and upper electrode structures 61 and 62 may include at least one conductive layer (e.g., of metal). But example embodiments of inventive concepts need not be limited thereto; for instance, in other modified example embodiments, a magnetic tunnel junction MTJ may be configured not to include one of the lower and upper electrode structures 61 and 62.

Applications of Embodiments

Figure 25:
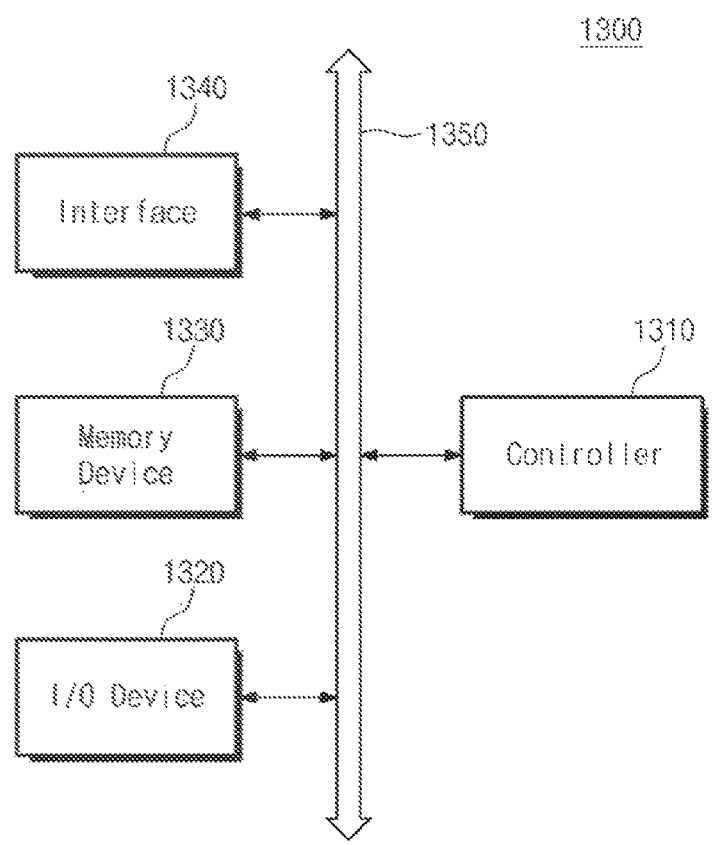
FIGS. 25 and 26 are schematic block diagrams schematically illustrating electronic devices including a semiconductor device according to example embodiments of inventive concepts.
Figure 26:
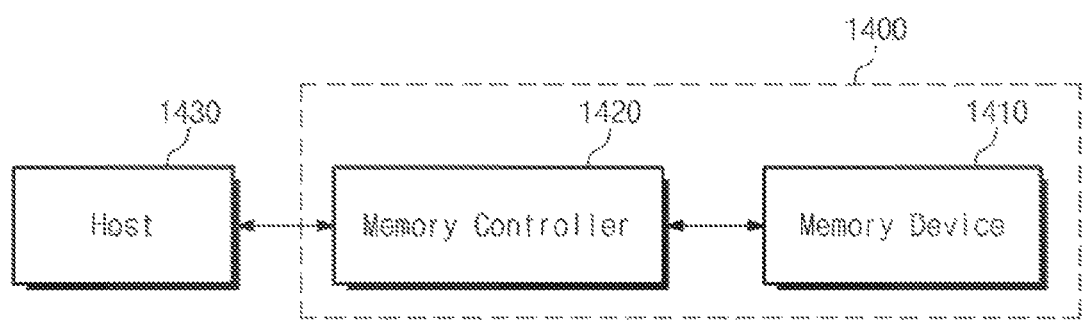

FIGS. 25 and 26 are block diagrams schematically illustrating electronic devices including a semiconductor device according to example embodiments of inventive concepts.

Referring to FIG. 25, an electronic device 1300 including a semiconductor device according to example embodiments of inventive concepts may be used in one of a personal digital assistant (PDA), a laptop computer, a mobile computer, a web tablet, a wireless phone, a cell phone, a digital music player, a wire or wireless electronic device, or a complex electronic device including at least two ones thereof. The electronic device 1300 may include a controller 1310, an input/output device 1320 such as a keypad, a keyboard, a display, a memory 1330, and a wireless interface 1340 that are combined to each other through a bus 1350. The controller 1310 may include, for example, at least one microprocessor, a digital signal process, a microcontroller or the like. The memory 1330 may be configured to store a command code to be used by the controller 1310 or a user data. The memory 1330 may include a semiconductor device according to example embodiments of inventive concepts. The electronic device 1300 may use a wireless interface 1340 configured to transmit data to or receive data from a wireless communication network using a RF signal. The wireless interface 1340 may include, for example, an antenna, a wireless transceiver and so on. The electronic system 1300 may be used in a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, and so forth.

Referring to FIG. 26, a memory system including a semiconductor device according to example embodiments of inventive concepts will be described. The memory system 1400 may include a memory device 1410 for storing large amounts of data and a memory controller 1420. The memory controller 1420 controls the memory device 1410 so as to read data stored in the memory device 1410 or to write data into the memory device 1410 in response to a read/write request of a host 1430. The memory controller 1420 may include an address mapping table for mapping an address provided from the host 1430 (e.g., a mobile device or a computer system) into a physical address of the memory device 1410. The memory device 1410 may be a semiconductor device according to example embodiments of inventive concepts.

The semiconductor memory devices disclosed above may be encapsulated using various and diverse packaging techniques. For example, the semiconductor memory devices according to the aforementioned example embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

The package in which the semiconductor memory device according to one of the above example embodiments is mounted may further include at least one semiconductor device (e.g., a controller and/or a logic device) that controls the semiconductor memory device.

According to example embodiments of inventive concepts, a magnetic tunnel junction may be configured to include an extrinsic perpendicular magnetization structure. The extrinsic perpendicular magnetization structure may include a plurality of magnetic layers and at least one perpendicular magnetization inducing structure interposed therebetween. Although each of the magnetic layers may be formed to a thickness smaller than a critical thickness required for the perpendicular magnetization property, a total thickness of the magnetically coupled magnetic layers in the magnetic tunnel junction can be greater than the critical thickness. The increase in the total thickness of the magnetic layers enables to improve thermal stability of perpendicular-type MTJs.

While example embodiments of inventive concepts have been particularly shown and described, it will be understood by one of ordinary skill in the art that variations in form and detail may be made therein without departing from the spirit and scope of the attached claims.

What is claimed is:

1. A magnetic tunneling junction device comprising:
   a first structure including a magnetic layer;
   a second structure including:
   a first extrinsic perpendicular magnetization layer;
   a second extrinsic perpendicular magnetization layer;
   a first non-magnetic layer on the first extrinsic perpendicular magnetization layer; and
   a second non-magnetic layer on the second extrinsic perpendicular magnetization layer,
   wherein the first structure is thicker than the second structure.

2. The device of claim 1, wherein at least one of the first and second non-magnetic layers comprise at least one of Ta, Ti, U, Ba, Zr, Al, Sr, Hf, La, Ce, Sm, Mg, Th, Ca, Sc, or Y.

3. The device of claim 1, further comprising a third non-magnetic layer on the second non-magnetic layer.

4. The device of claim 3, wherein the third non magnetic layer comprises at least one of Ru, Rh, Pd, Ag, Os, Ir, Pt, or Au.

5. The device of claim 1, wherein the first and second extrinsic perpendicular magnetization layers comprise CoFeB.

6. The device of claim 1, wherein the first structure further comprises an exchange coupling layer between two magnetization layers.

7. The device of claim 1, further comprising a tunnel barrier layer between the first structure and the second structure.

8. The device of claim 1, wherein the first structure further comprises at least two extrinsic perpendicular magnetization layers.

9. The device of claim 8, wherein the first structure further comprises a non-magnetic layer on the each extrinsic perpendicular magnetization layer.

10. The device of claim 8, wherein the each extrinsic perpendicular magnetization layer comprises CoFeB.

11. A magnetic tunneling junction device comprising:
    a first structure including a magnetic layer;
    a second structure including:
    a first extrinsic perpendicular magnetization layer;
    a second extrinsic perpendicular magnetization layer;
    a first non-magnetic layer on the first extrinsic perpendicular magnetization layer; and
    a second non-magnetic layer on the second extrinsic perpendicular magnetization layer,
    wherein the number of multi layers included in the first structure is more than the number of multi layers included in the second structure.

12. The device of claim 11, wherein at least one of the first and second non-magnetic layers comprise at least one of Ta, Ti, U, Ba, Zr, Al, Sr, Hf, La, Ce, Sm, Mg, Th, Ca, Sc, or Y.

13. The device of claim 11, further comprising a third non-magnetic layer on the second non-magnetic layer.

14. The device of claim 13, wherein the third non-magnetic layer comprises at least one of Ru, Rh, Pd, Ag, Os, Ir, Pt, or Au.

15. The device of claim 11, wherein the first and second extrinsic perpendicular magnetization layers comprise CoFeB.

* * * * *